United States Patent [19]

Faure et al.

[11] Patent Number: 4,554,506

[45] Date of Patent: Nov. 19, 1985

[54] MODULAR TEST PROBE

[75] Inventors: Louis H. Faure, Poughkeepsie; Dana R. Townsend, Fishkill; Thomas J. Walsh, Poughkeepsie, all of N.Y.

[73] Assignee: International Business Machines Corporation, Armonk, N.Y.

[21] Appl. No.: 680,232

[22] Filed: Dec. 10, 1984

Related U.S. Application Data

[63] Continuation of Ser. No. 278,950, Jun. 30, 1981, abandoned.

[51] Int. Cl.$^4$ .............................................. G01R 1/06
[52] U.S. Cl. ................................. 324/158 P; 324/72.5
[58] Field of Search ................ 324/158 P, 158 F, 72.5

[56] References Cited

U.S. PATENT DOCUMENTS

| | | | |
|---|---|---|---|
| 3,731,191 | 5/1973 | Bullard et al. | 324/158 F |
| 3,805,159 | 4/1974 | Richelmann | 324/158 F |
| 3,806,801 | 4/1974 | Bove | 324/158 F |
| 3,906,363 | 9/1975 | Fowler | 324/158 F |
| 3,911,361 | 10/1975 | Bove et al. | 324/158 P |
| 3,963,985 | 6/1976 | Geldermans | 324/158 F |

OTHER PUBLICATIONS

Faure, L. H.; "Contact Probe . . . ", IBM Tech. Dis. Bull.; vol. 19; No. 4; Sep. 1976; pp. 1267-1268.
Till, A. W.; "Column Contact Probe"; IBM Tech. Dis. Bull.; vol. 12; No. 4; Sep. 1969; p. 551.
Bruder et al. "Buckling Beam Probe", IBM Tech. Dis. Bull.; vol. 16; No. 5; Oct. 1973; p. 1366.
Cummins et al. "Fabrication of . . . "; IBM Tech. Dis. Bull.; vol. 16; No. 5; Oct. 1973; pp. 1606-1607.
Bruder et al.; "Dual Buckling . . . "IBM Tech. Dis. Bull.; vol. 17; No. 2; Jul. 1974; pp. 638-639.

*Primary Examiner*—Ernest F. Karlsen
*Attorney, Agent, or Firm*—Sughrue, Mion, Zinn, Macpeak, and Seas

[57] ABSTRACT

A test probe employing a buckling beam array for testing integrated circuits. A pair of identical sets of guides are positioned on either side of a centerpost to align the buckling beams. In one embodiment the holes in one set of guides is offset by a key to induce prebow in the beams. In another embodiment prebow is induced by a floating asymmetric separator positioned on the centerpost between the guide sets. When a force is applied to the probe, the beams deflect in the direction but to different extents so that a uniform force is applied to the surface of the IC irrespective of variations in height.

9 Claims, 4 Drawing Figures

U.S. Patent   Nov. 19, 1985   4,554,506
FIG.1
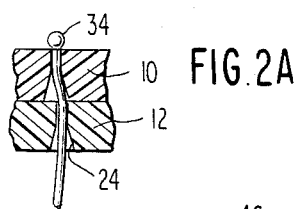
FIG.2A
FIG.2
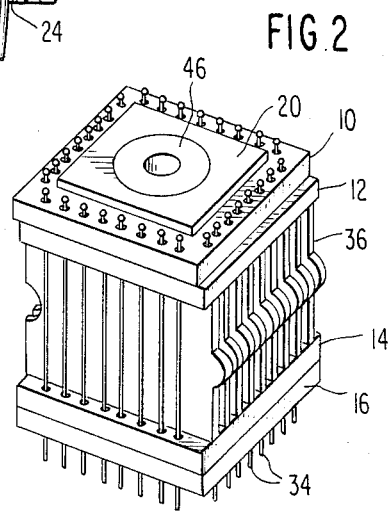
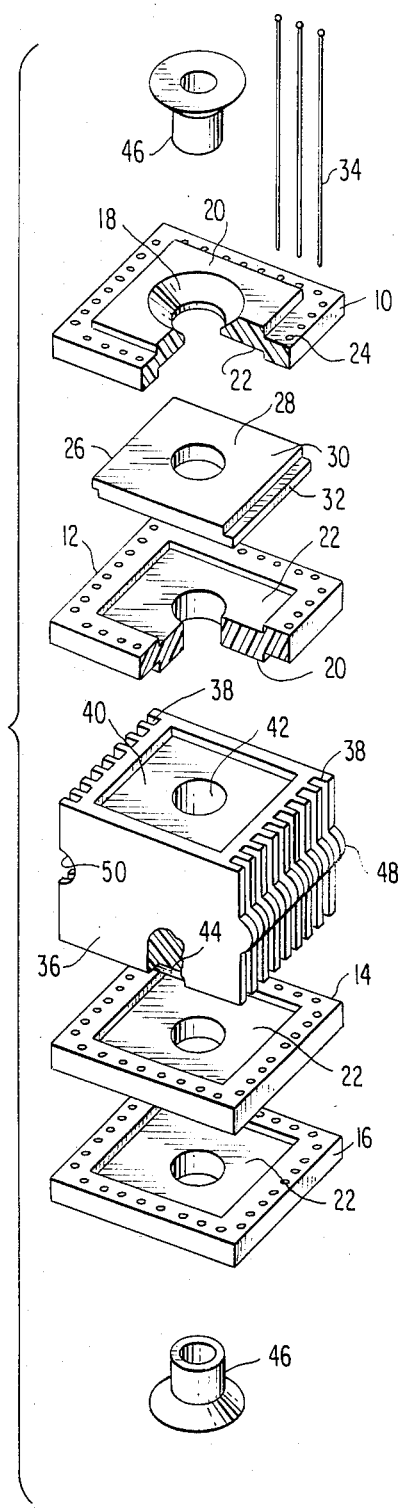
FIG.3
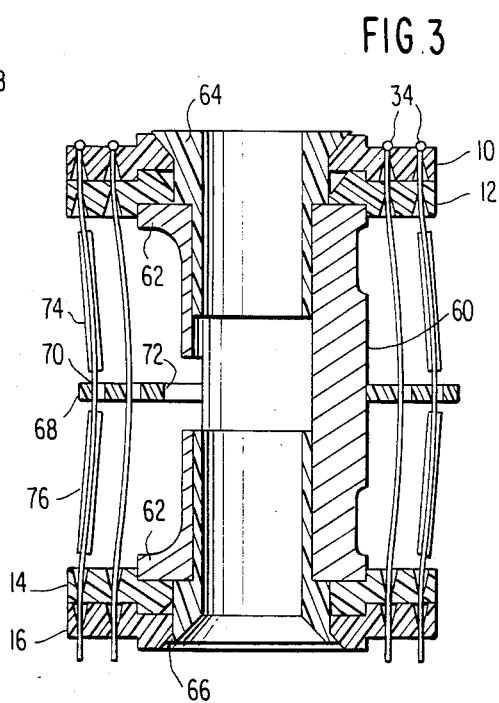

MODULAR TEST PROBE

This is a continuation, of application Ser. No. 278,950, filed June 30, 1981 now abandoned.

BACKGROUND OF THE INVENTION

1. Field of the Invention

This invention relates to probes for testing electrical characteristics of integrated circuits. In particular, this invention relates to a probe that contacts terminal pads for a semiconductor chip to act as an interface between those pads and a test device.

2. Prior Art

VLSI substrates utilize an array of semiconductor chips mounted on the surface of a multiple layer laminate structure. The chips are located at discreet sites and are typically surrounded by an array of terminal pads, for instance, EC (engineering change) terminal pads. Chip circuit arrays are formed in matrices, typically 3×3 or 10×10, thereby defining a regular pattern of pads on the substrate surface.

Given the number of EC pads in an array and the exceptionally small spacing between such pads, a probe is necessary to act as an interface between the device under test and the test device itself. The interface conventionally comprises a probe contactor defining an electrical interface between the substrate and the test device and a space transformer controlling the electrical environment to prevent distortion of test signals. The space transformer acts to transform a large number of electrical connectors provided in the tester into a highly dense array that is either similar to or identical to the pad density pattern on the substrate. Such space transformers are known in the technology, for example, shown in U.S. Pat. No. 3,911,361.

In addition to space density considerations, the mechanical characteristics of the substrate introduce difficulties in achieving a satisfactory interface between the space transformer and the substrate. For example, when processing multi-layered ceramic substrates, firing temperatures in the range of 1500° C. are utilized. These temperatures cause the uncured greensheets to shrink and thereby introduce variations in height and in the design size of the substrate. The locations of the chip sites move and there is a similar change in the distance between the EC pad array located circumferentially about the chip site.

If a probe is used having distances which are preselected to correspond to the design distances not only between chip sites but between pads, any deviation in dimension caused by processing makes it impossible to insure that each probe head will contact the respective pad at the chip site.

Additionally, in high temperature processing, variations in the height of the pads are produced. Unless sufficient force is applied to the probes, it may be impossible to insure contact between the probe and the pad having the lowest height. The introduction of such a force supplied to the end of the probe however produces a force on the pad having the greatest height from the substrate surface. If the force is excessive, the pad or the chip itself may be damaged during the test process.

In order to overcome these interface problems, it has been proposed in the prior art to utilize a probe contactor having buckling beam probes. The probes are placed in a housing having alignment dies with each probe configured to deflect over a range of predetermined forces such that the force applied to the pad is constant, that is, given varying heights of the pads, the same force would be applied to each pad by its respective contacting probe since, the probes will deflect to prevent any additional force beyond a predetermined force from being applied to the pad. The buckling also produces a wiping contact to cover an area greater than point contact. This compensates for pad location shifting.

Such a probe configuration is shown in U.S. Pat. No. 3,806,801. This patent shows a housing 11, and a metallic casting having upper and lower alignment dies 10 and 12. As shown in FIG. 1 of the '801 patent, a plurality of probes having electrically conductive wires 16 are supported by the alignment dies. The probes have an insulating cover to prevent electrical contact if they accidentally engage themselves during deflection. Typically, the wires are coated with parylene formed by vacuum deposition.

In order to control the buckling direction of the probes, the '801 patent suggests three techniques:

(a) offsetting the openings in the upper and lower alignment dies;

(b) disposing the opening of the upper alignment die at an angle relative to the corresponding opening in the lower alignment die to slant the longitudinal axis of the wire; and (c) a combination of offset and angular slanting.

Notwithstanding the advantages offered by a system described in U.S. Pat. No. 3,806,801, a number of deficiencies still remain. First, a significant amount of precision machining is required to construct alignment dies of the type described in the '801 patent, particularly if offsets and angular orientations are utilized to bias the buckling direction of the probes. Secondly, given the fact that VSLI structure is utilized, an array of chip sites, it is necessary to move the probe relative to the substrate to test each of those chip sites. Preferably, clustering of probes rather than in single rows as taught by the prior art should be used to reduce the test time required for a single substrate. In the case of a 10×10 array, groups of probes for example two rows, 20 probes, would be required in a clustered arrangement, not possible in the prior art. Additionally, the technique of biasing the beam probe while providing a high degree of confidence vis-a-vis pad contact does not guarantee uniform deflection or buckling when a predetermined axial load is applied thereto. That is, while predetermined buckling may take place, the direction may still vary, causing contact between the wires. Given this degree of unpredictability in buckling direction, prior art beam probes still utilize an insulating covering. Such a requirement however is unduly expensive.

Other prior art systems have been proposed to provide integrated circuit probe assemblies for use in continuity testing. Systems as proposed in U.S. Pat. No. 3,906,363 utilize a contactor assembly having a plurality of metal spring fingers making frictional contact with openings in a printed circuit board U.S. Pat. No. 3,731,191 shows a multi-probe assembly utilizing a number of probe guides having probe wires removably contained and compressible within the guide elements. The probe wires are designed so that when they are inserted within the probe guide they extend a controlled amount beyond the end of the housing while other ends abut against a pressure plate. The guides are curved to provide the probe wires inserted therein with a spring-like quality during compression. Such systems, while representing alternatives in the prior art with respect to probe assemblies, do not overcome the fundamental deficiencies of clustering, cost considerations and the like.

SUMMARY OF THE INVENTION

Accordingly, it is an object of this invention to provide an improved modular test probe compatible for use on multi-layer VLSI structures.

Another object of this invention is to provide a modular test probe having probe units which may be mounted in clusters to be used for testing at one time a matrix of chip sites on a substrate to be tested.

A further object of this invention is to provide a probe capable of acting as an interface between a multi-layer ceramic substrate and a test device for testing of electrical shorts and opens of integrated circuits.

Yet another object of this invention is to provide a modular test probe having a common guide design that can be used in all guide positions of the probe structure.

An additional object of this invention is to provide a probe for use with a continuity testing device that reduces the overall test time in the system by eliminating the requirement of repositioning the probe at different chip sites.

These and other objects of this invention are achieved by the use of a test probe having a modular configuration that is capable of mounting in clusters to test MLC arrays such as 2×2, 3×3 and the like. The probe utilizes molded guides having locating holes for the probe beams. The guides are identical in configuration and have an extrusion on the bottom side and a receiving cavity on the top side to achieve either proper alignment to the space transformer or to provide the necessary prebow to the probe beams. By the use of identical molded guides, the cost of manufacture of the probe structure is materially reduced. An offset key is utilized to displace a pair of guides relative to each other and achieve the necessary prebow of the probe beams as they pass through the two guides.

A center post and separator element is utilized to anchor the assembly and has a calculated height to give the probe a free length for buckling at a predetermined force. Channels are molded in the body to separate the probe beams and prevent electrical shorting between them. Accordingly, the requirement in the prior art that the probe beams be coated with an insulating material is eliminated. The center post utilizes a series of locating ears and cavities to allow clustering of adjacent probe elements. Additionally, the ear portions of the separator guides the beams as they buckle into channels of an adjacent clustered probe.

In an alternative embodiment, a float "beam separator" is utilized that moves laterally with the beams as they buckle. The separator is disposed asymmetrically about the center post to provide the required offset or bias causing the beams to flex uniformly in a given direction. In this embodiment, the ear or tab assembly is unnecessary since the floating separator moves laterally so that the beams can buckle, yet, the possibility of contact between adjacent probe assemblies is eliminated.

The following objects, features and advantages of this invention will become more apparent from the following more detailed and particular description of a preferred embodiment of the invention as illustrated in the accompanying drawings.

BRIEF DESCRIPTION OF THE DRAWINGS

FIG. 1 is an exploded perspective view showing the components forming the probe of this invention;

FIG. 2 is a perspective view showing an assembled probe assembly;

FIG. 2A is a cross-sectional view of elements 10 and 123 of FIG. 2 showing probe beam bias; and FIG. 3 is a cross-sectional view showing a second preferred embodiment of this invention.

DETAILED DESCRIPTION OF THE PREFERRED EMBODIMENT

Referring now to FIG. 1, an exploded perspective view of a first embodiment of this invention is shown. The modular test probe utilizes four guide elements 10, 12, 14, and 16. Each element is identical, made of a molded insulating material. Various types of plastics are suitable that allow precision molding. Each of the guides has a central opening 18, a boss or projection 20 on one surface and a corresponding recess 22 on an opposite surface. Disposed about the periphery of each guide are a series of throughholes 24. The holes are arranged to correspond to the orientation of the EC pad to be contacted by the probe beams. While FIG. 1 shows a single circumferential array of holes 24, it is understood that multiple annular arrays are equally applicable if the chip site has multiple EC frames. Holes 24 have a build-in taper lead for beams 34, for ease of insertion.

As shown in FIG. 1, when the guide 10 is disposed with the boss or locating extrusion 20 on the top side, alignment and clearance of the probe being relative to the space transformer (not shown) is achieved. An offset key 26 is interposed between guides 10 and 12. The offset key 26 has a central opening 28 and comprises two planar elements 30, 32. The upper planar element 30 nests into the locating cavity 22 of the upper guide 10. The lower planar element 32 nests in the locating cavity of the guide 22. Accordingly, as shown in FIG. 1, guides 10 and 12 are positioned with their locating cavities 22 abutting each other to receive the surfaces 30 and 32 of the offset key 26.

With the configuration shown in FIG. 1, the offset key, molded from the same material as the guide, provides a positive offset between the holes 24 and the guide 10 relative to the holes in the guide 12. When probe beams 34 are inserted through holes 24 in the guide 10 and through the guide 12, an offset is provided to prebow the probe beams 34. The geometry of hole 24, built-in taper, provides clearance for this bias of the probe beams. This is shown in the enlarged portion FIG. 2A. That is, the use of the offset key insures that the holes 24 in the guides 10 and 12 are not in axial alignment with each other.

The probe beams 34 are formed from a suitable material to allow deflection over a predetermined range when a predetermined force is actually applied to the wire. After the predetermined force has been reached, it remains substantially constant and deflection of the beam occurs. By this technique, disparities in forces applied to the probe beams caused by different pad heights are reflected in deflection of the beam as opposed to an increase in force supplied to the pad of the semiconductor chip contacted by the end of the beam.

A variety of materials can be used to form the beam probes 34. For example, BeNi, BeCu, tungsten, PALINEY, an electrical contact material manufactured by J. M. New Company, Bloomfield, Connecticut, or the like can be utilized.

The length of the beam is determined in a manner well known in this technology. The probe is designed in accordance with the formula $F=(3\pi)^2 EI/L^2$ where;

F is an axial load on the end of the probe 34 which will cause buckling of the probe, E is the modulus of elasticity of the material of the probe, I is the least moment of inertia of the probe, and L is the length of the probe.

In the case where the probe 34 is a solid rod of circular cross section, the least moment of inertia I is equal to $\pi D^4/64$ where, D is the diameter of the probe. It is apparent, however, that while a circular cross section is shown any other shape may be used, for example, rectangular, or square beam probes.

It is readily apparent from the above formula, the required length of the beam probe can be ascertained since E is a function of the material, D is known, and I is derived as a function of cross section. Hence, by controlling the length of the beam probe, a predetermined and selected force can be applied to the EC pad and no greater force will be exerted because the probe will simply deflect by bending or buckling when higher force levels are encountered.

As shown in FIG. 1, each of the beam probes 34 has a conductive ball tip formed of soldeer or the like to provide engagement between the probe wire and the space transformer. Other tip configurations may be used.

In the FIG. 1 embodiment, a center post and separator element 36 functions to anchor the assembly and has a calculated height to give each of the probe beams 34 a free length for buckling at a predetermined force. Channels 38 are molded into the body to separate the probe beams 34 and prevent electrical shorting between them. The center post has a recessed portion 40 that receives the locating extrustion 20 of the guide 12. A throughhole 42 is also provided to receive locking screws, to be described later. The bottom of the separator post has a boss or protrusion 44 which engages the recess or locating cavity 22 in the guide 14.

Guides 14 and 16 nest together by having the extrusion 20 rest in cavity 22 of guide 16. In this position, the holes in the respective guides are aligned and extrusion on guide 16 provides a positive stop and prevent overbuckling of the probe beams.

The entire assembly is held together by means of hollow screws 46. It is apparent that other coupling members may be used to lock the components of the probe together.

The ear portions 48 function to guide the beams as they buckle into the channels of adjacent probe. A secondary function is the compatibility of the ear and cavity members 48 and 50 on the center post and separator element 36. When the probes are mounted in a clustered arrangement for testing multiple chip sites during a single contact operation, the probes in each row can be aligned with each other utilizing those compatible elements. It is understood, however, that optical alignment can be used at each chip site takes place to align the probe, vis-a-vis the area to be tested. The primary function of the guides 48 is to prevent out of plane deflection of the probes as they buckle.

Referring now to FIG. 2, the completed probe assembly is shown. The probe is mounted on a movable arm that places the probe beams 34 in contact with each of the pads arrayed about the chip site. A space transformer, such as shown in U.S. Pat. No. 3,911,361, could be used in conjunction with an array of such probes. As the probes are placed over the chip site, a uniform wiping contact force to each pad occurs, thereby insuring uniform electrical contact. Variations in the height of the pads are accounted for by varying degrees of deflection of the individual probe beams. Contact with each pad is insured, yet potentially harmful excessive forces to the substrate are not transmitted. Once testing at a particular site or group of sites is completed, the probe assembly is moved to a different chip site on the substrate and testing then commences.

Referring now to FIG. 3, a second preferred embodiment of this invention is shown. In this embodiment, two pairs of guide elements are used in a compatible nested arrangement. That is, a first significant difference between this embodiment and that of FIG. 1 is that the offset key of the first embodiment is not employed. As shown in FIG. 3, guide 10 nests in guide 12 while guide 14 nests in guide 16. The two sets of guide elements are therefore used to provide initial alignment of the probe beams. As shown in FIG. 3, the holes 24 are tapered to allow for deflection of the beam elements as they protrude therethrough.

As in the case in the FIG. 1 embodiment, the probe beams 34 are formed from a suitable material that allows deflection of a predetermined range when a predetermined force is actually applied to the wire. After this force level has been reached, it remains substantially constant and deflection of the beam occurs. The same choice of materials defined with respect to the FIG. 1 embodiment can be used to form the probe elements 34 in the FIG. 3 embodiment.

As shown in FIG. 3, a center post 60 is employed having a projection 62 at each end which is sized to fit within the recess portion 22 of each of the guides. The guides are stacked on either end of the post 60 as shown in FIG. 3. They are held together in a compressive manner by means of bushings 64 and 66. It is clear that other means of fastening, allocating and biasing may readily be employed by those having working skill in this technology. Accordingly, a press fit is achieved between the projections 62 on the center post and the bushing assemblies holding the four guide elements in a position shown in FIG. 3.

The FIG. 3 embodiment differs from the FIG. 1 embodiment by the elimination of having the center post 60 act as a separator. In its place, a "floating beam" separator element 68 is used. The floating beam separator provides both prebow to the probe beams 34 and isolation. The separator 68 has an array of holes 70 which are symmetrical with respect to alignment, vis-a-vis the holes 24 in the guides. The floating beam separator 68, however, is disposed in an asymmetrical arrangement with respect to the center post 60. This offset is shown in FIG. 3 and is achieved by the placement of an asymmetric center hole 72 in the floating beam separator. Accordingly, when the separator 68 is mounted over the post 60, it is displaced asymmetrically with respect to the positioning of beams 34 with the guides 10, 12, 14 and 16. As shown in FIG. 3, the hole 70 in the floating beam separator are significantly larger than holes 24 in the guide elements. The holes are enlarged to allow for beam clearance and to allow for Z-displacement as the deflected beams pass through the separator element.

A series of standoffs 74–76 are placed over probe beams 34 disposed at the corner points of the probe to insure that the floating means separator 70 does not move vertically when the probe beams deflect.

The bottom surface of guide element 16 provides a positive stop and may be coated to prevent marring or damaging the surface of the IC under test. Alternatively, several variations of the embodiment of FIG. 3 may be employed. For example, a floating guide may be placed under guide plate 16 to reduce the protruding length of each probe beam. The floating guide reduces the susceptibility of the assembly to damage in bending yet moves with the probe. It may be retained by attachment to the through the probes with epoxy or other adhesive or may be mechanically assembled to the bottom guide 16. The floating guide, therefore, comprises a substantially flat plate having an array of holes corresponding to holes 24 in the guide elements and would be placed at the bottom end of the probe assembly to probe beams 34 protruding therethrough but at a reduced protruding length. Another variation would be to use guide pins disposed through the guide elements 14 and 16 to contact the floating guide at a particular angular orientation. For example, if six degree offset were utilized, the bottom tips of the probe beams would be deflected at a uniform angular relationship to produce the desired wipe of the probes at the point of contact. Such guide pins could be inserted through guide pin holes machined through the lower two guide elements 14 and 16 and the floating guide plate. Pins would be pressed into the bottom of the floating guide plate which would then slip fit into the upper guides. Accordingly, in this embodiment, in addition to the prebow of the probe beams 34 produced by the use of the floating separator element 68, the bottom portion of the probe beams 34 would be further deflected at a desired angular relationship to insure that the desired wiping of the probes at the contact surface occurs.

For example, other techniques of biasing may be employed, such as using the off-set lay of FIG. 1 in the FIG. 3 embodiment. In such a modified structure the bias of the floating separator would be used.

It is apparent that other modifications of this invention can be made without departing from the essential scope of this invention.

What is claimed is:

1. A probe assembly for clustering deflectable beam elements in an array corresponding to an array of surface terminals of an integrated circuit to be tested comprising:
   a plurality of straight deflectable beam elements;
   first guide means having an aperture and a plurality of through-holes around said aperture for receiving said beam elements to space and align them in a predetermined orientation,
   second guide means having an aperture and a plurality of through-holes around said aperture for receiving beam elements to space and align them in a predetermined orientation,
   a center post having said first and second guide means mounted on opposite ends thereof and establishing a predetermined separation distance therebetween, said beam elements positioned by said first and second guide means and around said center post, and
   fastener means positioned in said apertures uniting said center post and said first and second guide means in a single assembly, wherein said first guide means causes said beams elements to prebow in said predetermined orientation and to buckle under an applied load in various degrees but in the same direction without contacting each other when beams ends contact the surface of the integrated circuit under test to establish a uniform predetermined beam contact force.

2. A probe assembly for arraying clustered buckling beam elements for electrical testing an integrated circuit comprising:
   a plurality of straight deflectable beam elements,
   means defining a center post,
   first and second buckling beam guide means disposed at ends of said center post, said first and second buckling beam guide means having an aperture and a plurality of through-holes around said aperture,
   fastener means to secure said first and second guide means to said center post, and
   means on said first and second buckling beam guide means to prebow said beams elements in one direction between said first and second guide means, wherein said beam elements buckle in various degrees but in the same direction when a load is applied to said beam elements so that variations in the height of contact points for said beam elements cause buckling without increasing the force applied to said contact points.

3. The assembly of claims 1 or 2 wherein said first and second guide means comprise pairs of identical guide elements.

4. The assembly of claim 3 wherein each guide element in the pair is identical.

5. The assembly of claim 1 wherein said first guide means have throughholes offset from said second guide means for deflecting said beams in a predetermined bowed orientation.

6. The assembly of claim 3 wherein said first guide means comprises an offset key positioned between guide elements of one pair to offset the throughholes in each guide element for deflecting beam elements passing therethrough.

7. The assembly of claim 3 further comprising a locating extrusion on one side of each guide element and a compatible locating cavity disposed on an opposite side thereof, wherein said locating extrusion of one guide element nests in a locating cavity of a second guide element.

8. The assembly of claim 7 further comprising an offset key having surfaces compatible with said locating cavity wherein when said offset key is positioned between a pair of guide elements having its surfaces nested in said locating cavities the throughholes of each of the guide elements are not aligned to thereby prebow beam elements passing therethrough.

9. The assembly of claim 1 further comprising tab and insert means on said centerpost to orient buckling of one beam assembly with an adjacent beam assembly such that multiprobe assemblies corresponding to an integrated circuit array can be positioned over each array of surface terminals.

* * * * *